United States Patent
Zhang et al.

(10) Patent No.: US 11,601,109 B2
(45) Date of Patent: Mar. 7, 2023

(54) RF IMPEDANCE MEASUREMENT CIRCUIT

(71) Applicant: IMEC VZW, Leuven (BE)

(72) Inventors: Yang Zhang, Heverlee (BE); Pierre Wambacq, Groot-Bijgaarden (BE)

(73) Assignee: IM EC VZW, Leuven (BE)

( * ) Notice: Subject to any disclaimer, the term of this patent is extended or adjusted under 35 U.S.C. 154(b) by 30 days.

(21) Appl. No.: 17/357,543

(22) Filed: Jun. 24, 2021

(65) Prior Publication Data

US 2021/0408993 A1    Dec. 30, 2021

(30) Foreign Application Priority Data

Jun. 30, 2020    (EP) .................................. 20183305

(51) Int. Cl.
| | |
|---|---|
| *H03H 7/40* | (2006.01) |
| *G01R 27/16* | (2006.01) |
| *H04B 1/04* | (2006.01) |
| *H04B 1/18* | (2006.01) |

(52) U.S. Cl.
CPC .............. *H03H 7/40* (2013.01); *G01R 27/16* (2013.01); *H04B 1/0458* (2013.01); *H04B 1/18* (2013.01)

(58) Field of Classification Search
CPC .......... H03H 7/40; G01R 27/16; G01R 27/04; H04B 1/0458; H04B 1/18
See application file for complete search history.

(56) References Cited

U.S. PATENT DOCUMENTS

| | | | |
|---|---|---|---|
| 4,780,661 A | 10/1988 | Bolomey et al. | |
| 2008/0266021 A1* | 10/2008 | Van Bezooijen | H04B 1/0458 333/32 |
| 2009/0066440 A1 | 3/2009 | Chan Wai Po et al. | |
| 2010/0321086 A1 | 12/2010 | See et al. | |
| 2012/0169566 A1 | 7/2012 | Chan Wai Po et al. | |
| 2012/0249259 A1 | 10/2012 | Keese et al. | |
| 2012/0256689 A1* | 10/2012 | Elkaamouchi | H03H 7/40 330/185 |

(Continued)

FOREIGN PATENT DOCUMENTS

| | | |
|---|---|---|
| EP | 0922963 A2 | 6/1999 |
| EP | 3010148 A1 | 4/2016 |

(Continued)

OTHER PUBLICATIONS

Extended European Search Report and Written Opinion, Application No. EP20183305.0, dated Dec. 15, 2020, 11 pages.

(Continued)

*Primary Examiner* — Yuwen Pan
*Assistant Examiner* — Fatuma G Sherif
(74) *Attorney, Agent, or Firm* — McDonnell Boehnen Hulbert & Berghoff LLP

(57) ABSTRACT

An RF impedance measurement circuit includes a sensing capacitor connectable with an RF signal path; a first amplitude detector and a first frequency divider, each coupled, with the measurement circuit in operation, to the RF signal path at a first terminal of the sensing capacitor; a second amplitude detector and a second frequency divider, each coupled, with the measurement circuit in operation, to a second terminal of the sensing capacitor; and a phase detection circuit connected to an output of the first frequency divider and to an output of the second frequency divider.

20 Claims, 3 Drawing Sheets

(56) References Cited

U.S. PATENT DOCUMENTS

2016/0164495 A1* 6/2016 Backes ............... H04B 1/0053
455/77
2017/0093167 A1* 3/2017 Von Novak, III ...... H02J 50/12
2020/0395662 A1* 12/2020 Tervo .................. H04B 7/0617

FOREIGN PATENT DOCUMENTS

EP 3067703 A1 9/2016
FR 2560998 A1 9/1985

OTHER PUBLICATIONS

Van Bezooijen, Andre, Maurice A. De Jongh, Freek Van Straten, Reza Mahmoudi, and Arthur HM Van Roermund. "Adaptive impedance-matching techniques for controlling L networks." IEEE Transactions on Circuits and Systems I: Regular Papers 57, No. 2 (2009): 495-505.

Borg, G. G. "A broad-band amplitude-independent phase measuring system." Journal of Physics E: Scientific Instruments 20, No. 10 (1987): 1216.

* cited by examiner

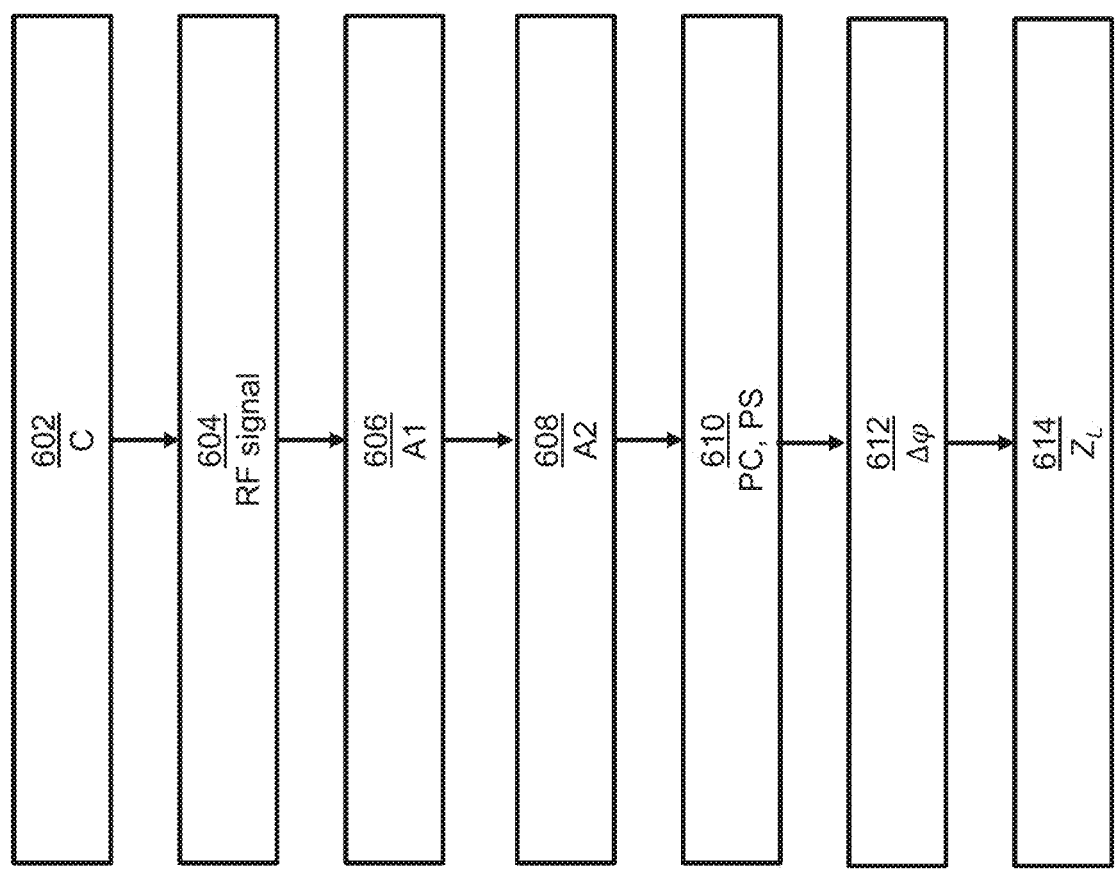

RF IMPEDANCE MEASUREMENT CIRCUIT

CROSS-REFERENCE TO RELATED APPLICATIONS

The present application is a non-provisional patent application claiming priority to European Patent Application No. 20183305.0, filed on Jun. 30, 2020, the contents of which are hereby incorporated by reference.

FIELD OF THE DISCLOSURE

The present inventive concept relates to an RF impedance measurement circuit, an RF transmitter arrangement comprising the circuit, an RF phase-array comprising a plurality of the circuit, and to a method of RF impedance measurement.

BACKGROUND

Radio frequency (RF) impedance measurement circuits are known. However, they are generally not suitable for use at high frequencies, such as in the millimeter-wave range, for example in radio-frequency integrated circuit (RFIC) designs.

SUMMARY

The present disclosure provides an RF impedance measurement circuit that may extend the range of operation into frequencies corresponding to the millimeter-wave range.

According to a first aspect, there is provided an RF impedance measurement circuit, comprising:

a sensing capacitor connectable in series with an RF signal path;

a first amplitude detector and a first frequency divider, each coupled, with the measurement circuit in operation, to the RF signal path at a first terminal of the sensing capacitor;

a second amplitude detector and a second frequency divider, each coupled, with the measurement circuit in operation, to a second terminal of the sensing capacitor; and a phase detection circuit connected to an output of the first frequency divider and to an output of the second frequency divider.

This typically allows for the respective outputs of the first frequency divider and the second frequency divider to have a constant amplitude, so that amplitude variation in the measured signal is eliminated while phase information is maintained. In turn, this generally allows for accurate phase detection at high frequencies without being influenced by amplitude variations, and thereby accurate RF complex impedance measurement at high frequencies.

The frequency divider may, for example, have a division factor of 2, although other division factors are equally possible.

Compared to using a log amplifier, amplitude-dependent delay caused by the log amplifier, which causes excessive error to the phase detection, especially at higher frequencies, is avoided.

Furthermore, through an appropriate choice of the capacitance of the sensing capacitors, this arrangement may provide a negligible loading effect to the circuits driving the RF signal path, such as a power amplifier, so that output power, linearity, and efficiency can be maintained compared to the situation of not having the RF impedance measurement circuit connected.

According to an embodiment, the phase detection circuit is a mixer configured to mix the output of the first frequency divider and the output of the second frequency divider. This generally allows for accurate phase determination using a relatively simple circuit.

According to an embodiment:

the phase detection circuit is a first phase detection circuit and the RF impedance measurement circuit further comprises a second phase detection circuit;

the first frequency divider and the second frequency divider comprises a respective first output;

the first frequency divider further comprises a second output phase offset with respect to the first output of the first frequency divider, the first phase detection circuit is connected to the first output of the first frequency divider and to the first output of the second frequency divider; and the second phase detection circuit is connected to the second output of the first frequency divider and to the first output of the second frequency divider.

Using a first phase detection circuit and a second phase detection circuit, where an input to the second phase detection circuit is phase offset with respect to the corresponding input from the same frequency divider to the first phase detection circuit, can allow for better reconstruction of the phase difference, for example in resolving phase ambiguities, and/or allowing for further improvement of phase detection accuracy through post-processing using redundant information.

Similar to the first phase detection circuit, the second phase detection circuit may be a second mixer configured to mix the second output of the first frequency divider with the first output of the second frequency divider.

According to an embodiment, first output is an in-phase output and the second output is a quadrature output.

The quadrature output has a 90-degree phase shift as compared to the in-phase output. Hereby, the output of the first phase detection circuit, in the form of a mixer, may be configured to be a cosine function of the phase difference between the first terminal and the second terminal of the sensing capacitor, divided by the division factor of the frequency divider. Further, the output of the second phase detection circuit, in the form of a mixer, may be configured to be a sine function of the phase difference, divided by the division factor of the frequency divider. This allows for simple accurate reconstruction of the phase difference in the full 360-degree range.

According to an embodiment, the RF impedance measurement circuit further comprises a voltage divider connectable to the RF signal path, wherein the first amplitude detector and the first frequency divider are connected to a midpoint of the voltage divider.

Further, the RF impedance measurement circuit may comprise a second voltage divider connectable to the RF signal path, wherein the second amplitude detector and the second frequency divider are connected to a midpoint of the second voltage divider.

The voltage divider may reduce the voltage swing to a safe operating range of the following circuits, i.e., the respective amplitude detector and frequency divider, for example in the case of a large output power being present on the RF signal path.

According to an embodiment, the voltage divider is a capacitive voltage divider.

According to an embodiment, the voltage divider comprises an adjustable capacitor.

Further, there may be provided an RF transmitter arrangement, comprising the RF impedance measurement circuit according to the first aspect, and the RF signal path, the RF transmitter arrangement further comprising an RF transmitter and an antenna, wherein the antenna is connected to the RF transmitter through the RF signal path.

Hereby, a convenient arrangement of integrating an RF transmitter with the RF impedance measurement circuit is achieved.

According to an embodiment, the RF transmitter arrangement further comprises a tunable matching network in the RF signal path.

Alternatively or additionally, a power amplifier (PA) comprised in the RF transmitter may have a tunable source impedance.

Hereby, a load impedance of the RF signal path, such as the matching network, or the tunable source impedance, may be tuned based on a load measured by the RF impedance measurement circuit, potentially increasing efficiency in the system as reflected signals/standing waves may be reduced.

Further, there may be provided an RF phased-array transmitter system comprising a plurality of RF impedance measurement circuits according to the above and each RF signal path, the RF phased-array transmitter system further comprising a plurality of antennas, each antenna of the plurality of antennas being connected to an RF transmitter through each RF signal path.

In an ideal phased array system, each transmitting path works independently from each other, i.e., there is no mutual coupling existing between any two paths. All power amplifiers (PAs) see an identical load impedance, normally 50Ω, from their corresponding antennas. When the radiated beam is pointed to any desired direction, the beam is in the desired shape and the fidelity of the modulated signal is maintained.

However, in practical applications, mutual coupling exists between any two antennas in the array. The electromagnetic wave that radiates out from one antenna will leak to other antenna paths, resulting in a reflected energy on the respective RF signal path. The corresponding PA will thus see a mismatched/undesired load impedance, leading to decreased output power and energy efficiency for each antenna, to non-linear distortion on modulated signal, and to the radiated beam being out of shape and the array EIRP decreasing.

Through integration of the RF impedance measurement circuit, such effects may be eliminated, or at least mitigated, based on tuning a load impedance of the respective RF signal path.

According to a second aspect, there is provided a method of RF impedance measurement, the method comprising:

detecting a first amplitude at a first amplitude detector coupled to a first terminal of a sensing capacitor connected in series with an RF signal path;

detecting a second amplitude at a second amplitude detector coupled to a second terminal of the sensing capacitor;

detecting a value indicating a phase difference between the first terminal and the second terminal based on an output of a first frequency divider and an output of a second frequency divider, wherein an input of the first frequency divider is coupled to the first terminal and an input of the second frequency divider is coupled to the second terminal; and calculating a load impedance of the RF signal line based on the first amplitude, the second amplitude, the value indicating the phase difference, and a capacitance of the sensing capacitor.

According to an embodiment, the detecting of the value indicating the phase difference comprises a mixer mixing the output of the first frequency divider with the output of the second frequency divider.

According to an embodiment, the method further comprises:

detecting a second value indicating the phase difference between the first terminal and the second terminal based on a second output of the first frequency divider phase offset with respect to the first output of the first frequency divider and the output of the second frequency divider, wherein the calculating further is based on the second value.

Further, there may be provided a method of impedance tuning of an RF transmitter arrangement, the RF transmitter arrangement comprising an RF transmitter connected to an antenna through an RF signal path, the method comprising:

the RF transmitter transmitting an RF signal through the RF signal path;

measuring a load impedance for the RF signal path through the method according to the above; and tuning a tunable impedance in the RF signal path based on the measuring.

The tunable impedance may be comprised in a tunable matching network in the RF signal path. Alternatively, or additionally, the tunable impedance may be comprised in a source impedance of the RF transmitter.

According to an embodiment, the RF transmitter is comprised in a phased-array transmitter system.

BRIEF DESCRIPTION OF THE FIGURES

The above, as well as additional, features will be better understood through the following illustrative and non-limiting detailed description of example embodiments, with reference to the appended drawings. In the drawings like reference numerals will be used for like elements unless stated otherwise.

FIG. 3 is a flow diagram of a method of RF impedance measurement, according to an example.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
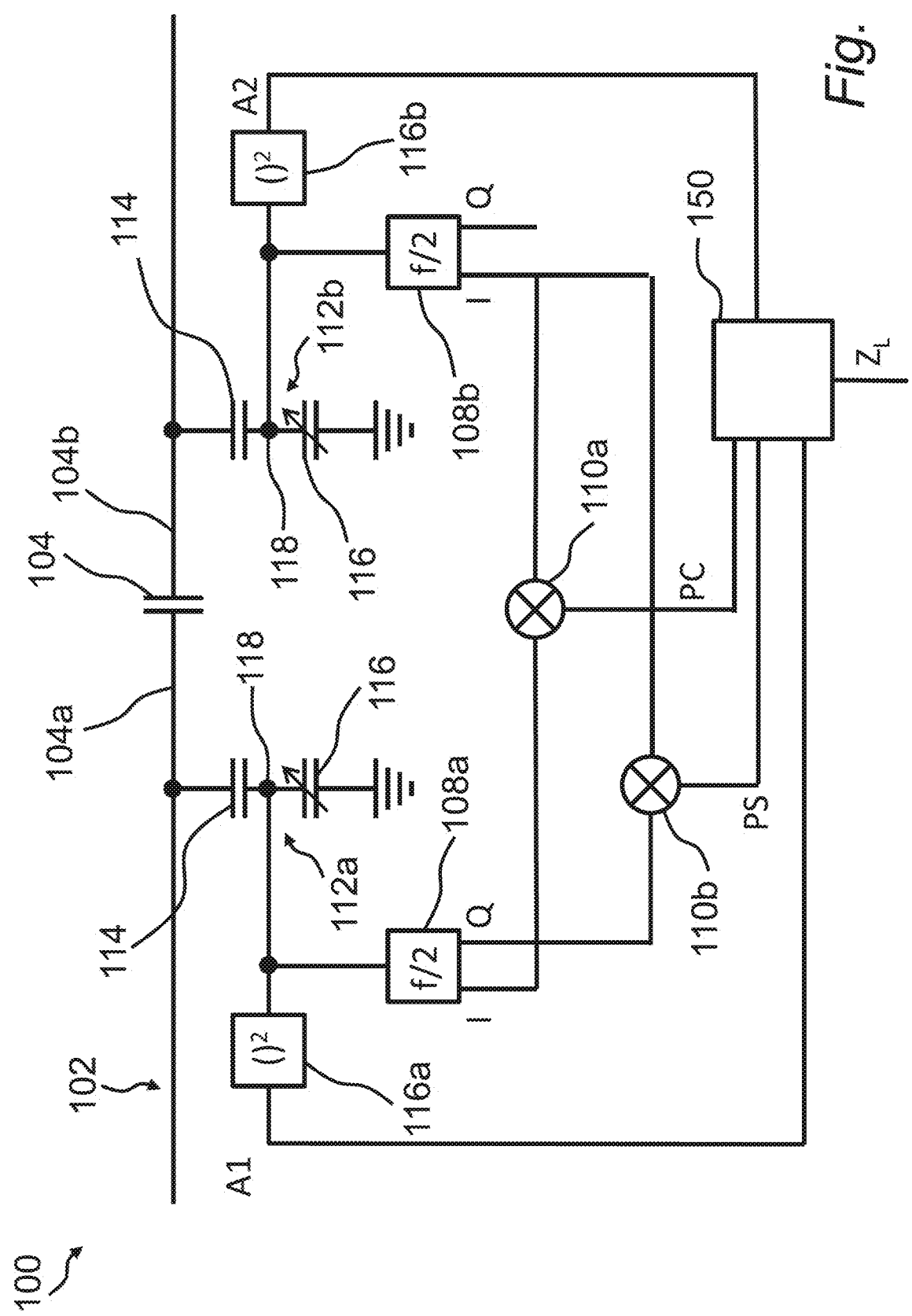
FIG. 1 is a block diagram of an RF impedance measurement circuit connected in series with an RF signal path, according to an example.

FIG. 1 shows a schematic diagram of an RF impedance measurement circuit 100 connected to an RF signal path 102, which may be a transmission line, coaxial cable, or similar. The RF signal path 102 may, for example, connect a power amplifier (PA) to an antenna, or to a tunable matching network (TMN).

The RF impedance measurement circuit 100 is connected (e.g., in series) with the RF signal path 102 through a sensing capacitor 104. The sensing capacitor 104 has a capacitance C which is a design parameter of the circuit, which may be determined by the skilled person based on required design specifications. A small value of C may typically result in more of an impact on the performance of the device, such as a PA, driving the RF signal path, due to alteration of the impedance matching situation, while typically allowing for increased measurement accuracy. Conversely, a larger value of C may typically lead to less of an impact on the performance of the device driving the RF signal path, typically at the expense of decreased measurement accuracy.

The RF impedance measurement circuit 100 comprises a first amplitude detector 116a and a first frequency divider 108a, both coupled to the RF signal path 102 at a first terminal 104a of the sensing capacitor 104.

Further, the RF impedance measurement circuit 100 comprises a second amplitude detector 116b and a second frequency divider 108b, both coupled to the RF signal path 102 at a second terminal 104b of the sensing capacitor 104.

The first frequency divider 108a and the second frequency divider 108b each may function as an injection-locked oscillator, whose self-oscillation frequency is set to be close to an integer fraction of the working frequency, for example, half the working frequency. In other words, as illustrated in FIG. 1, the first frequency divider 108a and the second frequency divider 108b may have a division factor of n=2. However, other fractions of the input frequency, such as n=3, 4, 5 . . . are equally possible, as well as a factor of n=1.

The first amplitude detector 116a may output a first detected amplitude A1 and the second amplitude detector 116b may output a second detected amplitude A2.

Each of the first frequency divider 108a and the second frequency divider 108b may comprise one or two outputs, wherein the optional second output may be phase-offset with respect to the first output.

For example, as depicted in FIG. 1, each of the first frequency divider 108a and the second frequency divider 108b may comprise and in-phase output I and a quadrature output Q, wherein each quadrature output Q may be phase shifted 90 degrees with respect to the corresponding in-phase output I. Other phase shifts than 90 degrees are equally possible.

As depicted, a first mixer 110a may be connected to the in-phase output I of the first frequency divider 108a and to the in-phase output I of the second frequency divider 108b and be configured to mix the analog in-phase output I of the first frequency divider 108a with the analog in-phase output I of the second frequency divider 108b, thereby functioning as a phase detection circuit, i.e., a phase detector.

Further, a second mixer 110b may, as depicted in FIG. 1, be connected to the quadrature output Q of the first frequency divider 108a and to the in-phase output I of the second frequency divider 108b, and be configured to mix their respective analog outputs, thereby functioning as a phase detection circuit, i.e., a phase detector.

Further, the RF impedance measurement circuit 100 may comprise a first voltage divider 112a and a second voltage divider 112b.

As depicted schematically in FIG. 1, each of the first voltage divider 112a and the second voltage divider 112b may be a capacitive voltage divider, each comprising a respective first, fixed, capacitance 114 and a respective second, tunable, capacitance 116 connected (e.g., in series) between ground and, respectively, the first terminal 104a of the sensing capacitor 104 and the second terminal 104b of the sensing capacitor 104.

Each second capacitance 116 may be adjustable.

The attenuation level of the two voltage-dividers may be designed to be the same at all times so that the ratio of the two voltage-divider midpoints is the same as the voltage ratio of the two terminals of the sensing capacitor 104. Additionally, when passing through these two voltage-dividers 112a and 112b, the signals will have the same delay. Therefore, the phase difference may also be maintained.

The first amplitude detector 116a/the first frequency divider 108a and the second amplitude detector 116b/the second frequency divider 108b are coupled to respective midpoints 118 between the respective first capacitance 114 and second capacitance 116 and are thereby coupled, respectively, to the first terminal 104a and the second terminal 104b of the sensing capacitor 104.

A processing unit 150 may be connected to the output A1 of the first amplitude detector 116a, to the output A2 of the second amplitude detector 116b, to the output of the first mixer 110a and to the output of the second mixer 110b.

The RF impedance measurement circuit and the processing unit 150 may together form an RF impedance measurement system.

Figure 2:
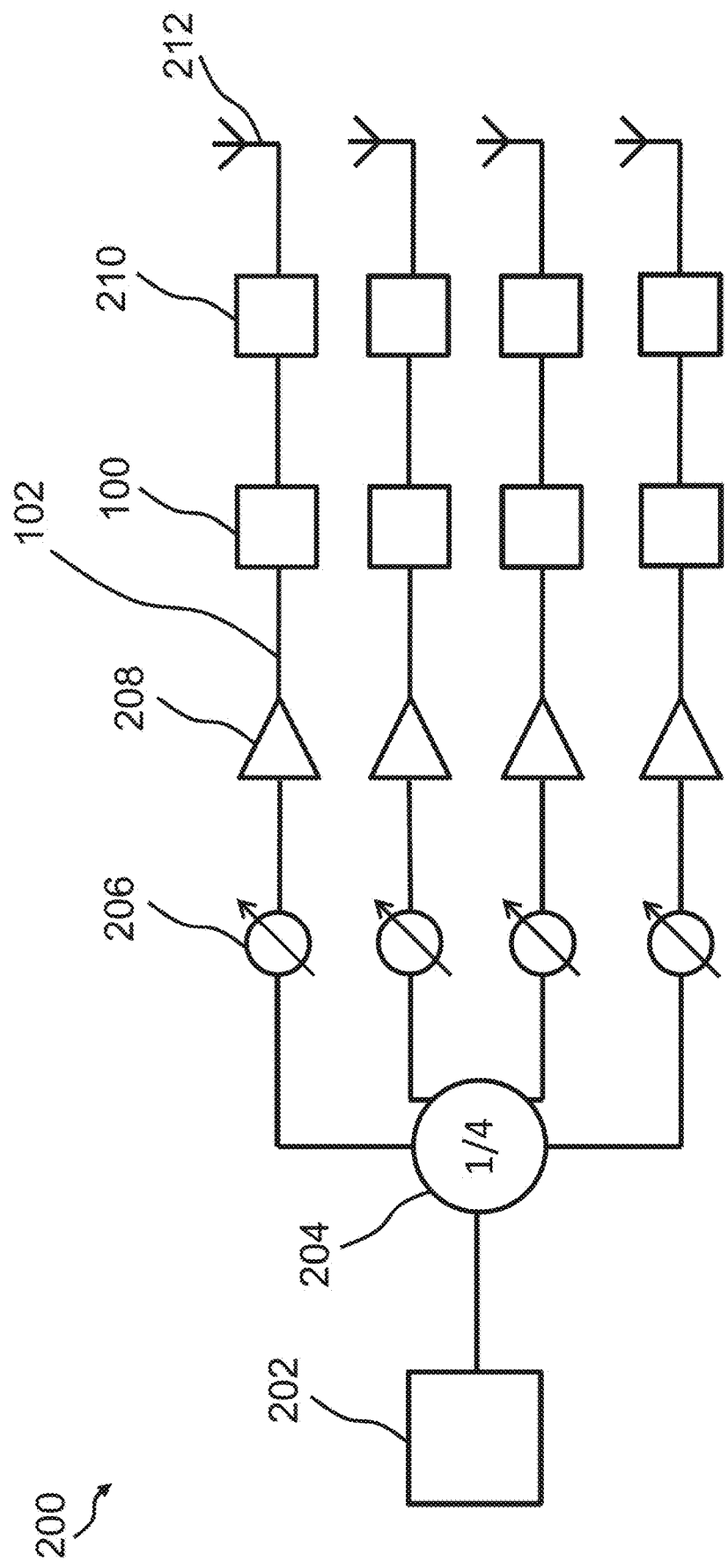
FIG. 2 is a block diagram of an RF transmitter arrangement, according to an example.

FIG. 2 shows an RF transmitter arrangement 200. The RF transmitter arrangement 200 may, as shown, be a phase-array transmitter system, as exemplified in FIG. 2 with four antennas. Alternatively, the RF transmitter arrangement 200 may comprise just one antenna. The phase-array transmitter may be configured to operate at millimeter-wave wavelengths, for example for communication and/or sensing applications.

The RF transmitter arrangement 200 comprises a signal generator 202, configured to generate an RF signal, which may have an angular frequency $\omega$.

In the depicted case of four antennas, the RF transmitter arrangement 200 may comprise a four-way splitter 204. In the general case of transmitting using n antennas, the RF transmitter arrangement 200 may comprise an n-way splitter connected to the signal generator 202.

In the case of a phase-array transmitter system, as depicted, connected to each output of the splitter 204 may be a respective phase-delay circuit 206. Each respective phase-delay circuit 206 may be configured to provide a specific phase delay to provide a desired antenna beam or transmit pattern.

As depicted, connected to each phase-delay circuit 206 is a respective power amplifier 208 (PA). Alternatively, for example, in the case of a one-antenna system, the power amplifier 208 may be connected directly to the signal generator 202. The power amplifier 208 may comprise a tunable source impedance.

Each power amplifier 208 is connected to a respective antenna 212 through a respective RF signal path 102, to which an RF impedance measurement circuit 100, as described above in conjunction with FIG. 1, is connected (e.g., in series).

In each RF signal path 102, downstream of the respective RF impedance measurement circuit 100 and before the respective antenna 212, there may be a tunable matching network 210, comprising a tunable load impedance as seen by the RF signal path 102.

Thus, the RF transmitter arrangement 200, comprises the RF impedance measurement circuit 100 (cf. FIG. 1) and the RF signal path 102, an RF transmitter—comprising the signal generator 202, the optional n=4-way splitter 204 and each power amplifier 208—and each antenna 212, where each antenna 212 is connected to the RF transmitter through each respective RF signal path 102.

FIG. 3 is a flow diagram of a method example 600 of RF impedance measurement.

The method may be implemented using the RF impedance measurement circuit 100 and the processing unit 150 (cf. FIG. 1).

Optionally, the method may be implemented in the RF transmitter arrangement 200 of FIG. 2 for tuning the RF transmitter arrangement 200, wherein a load impedance for the RF signal is measured.

Optionally, at 602, the RF impedance measurement circuit 100 may be connected to the RF signal path 102, for example by connecting the sensing capacitor 104 in series with the RF signal path 102.

Optionally, at 604, when implementing the method example in the RF transmitter arrangement 200 of FIG. 2, the RF transmitter 202-208 may transmit an RF signal through each RF signal path 102, to the respective antenna 212.

At 606, a first amplitude A1 may be detected and output by the first amplitude detector 116a.

At 608, a second amplitude A2 may be detected and output by the second amplitude detector 116b.

At 610, the first mixer 110a may mix the output of a first frequency divider 108a with the output of the second frequency divider 108b.

In the depicted case (cf. FIG. 1) of the first mixer 110a being connected to the in-phase output I of the first frequency divider 108a and the in-phase output I of the second frequency divider 108b, the output PC of the first mixer 110a will be proportional to a cosine function of the phase difference between the voltage at the first terminal 104a of the sensing capacitor 104 and the voltage at the second terminal 104b of the sensing capacitor 104, divided by the division factor n of each of the first frequency divider 108a and the second frequency divider 108b and therefore indicating, i.e., representing, that phase difference.

Further, still at 610 (FIG. 6) and as depicted in FIG. 1, with the second mixer 110b being connected to the quadrature output Q of the first frequency divider 108a and the in-phase output I of the second frequency divider 108b, the output PS of the second mixer 110b will be proportional to a sine function of the phase difference between the voltage at the first terminal 104a of the sensing capacitor 104 and the voltage at the second terminal 104b of the sensing capacitor 104, divided by the division factor n of each of the first frequency divider 108a and the second frequency divider 108b, and therefore, as well, indicating, i.e., representing that phase difference.

At 612, the processing unit 150 (cf. FIG. 1) may calculate a load impedance $Z_L$ of the RF signal path 102 based on the detected first amplitude A1, the detected second amplitude A2, the value indicating the phase difference, and a capacitance C of the sensing capacitor.

For example, the phase difference $\Delta\varphi$ between the first terminal 104a and the second terminal 104b may be, at least for a range of values of $\Delta\varphi$, be reconstructed as $\Delta\varphi = n \arccos PC$, or $\Delta\varphi = n \arcsin PS$.

wherein n is the division factor of each of the first frequency divider 108a and the second frequency divider 108b. As noted above, in the depicted example in FIG. 1, n=2.

Assigning, for calculation purposes, the voltage at the first terminal 104a a phase of zero, that voltage may be represented by a complex number $V_1 = A1 e^{0j}$ Similarly, the voltage at the second terminal 104b may be represented by a complex number $V_2 = A2 e^{j\Delta\varphi}$ Alternatively, the calculation may be based on both outputs PS and PC, allowing for unambiguous reconstruction of the phase difference $\Delta\varphi$ in a larger range of values and/or larger reconstruction accuracy.

The complex impedance $Z_L$ of the RF transmission line 102 (cf. FIG. 1) may then be calculated as $$Z_L = \frac{Z_C}{\frac{V_1}{V_2} - 1}$$

wherein $Z_C = 1/(j\omega C)$ is the complex impedance of the sensing capacitor 104, wherein $\omega$ is the angular frequency of a signal on the RF transmission line.

As seen from the equation above, the relationship of the two complex voltages is of interest while knowing their absolute values is not required. To be specific, three parameters are generally required to determine the complex impedance $Z_L$: the capacitance C of the sensing capacitor 104, the amplitude ratio A1/A2, and the phase difference $\Delta\varphi$.

The output of the circuit can be used to determine not only the complex load impedance that the power amplifier 208 sees through the RF signal path 102, but also can be used to measure the true power delivered to the load.

Optionally, at 614, when implementing the method example in the RF transmitter arrangement 200 of FIG. 2, the respective tunable matching network 210 and/or source impedance of the respective power amplifier 208 may be tuned based on the measured $Z_L$. Thereby, through appropriate tuning of the matching network 210, an actual load of the RF signal path 102 may be reconfigured to a desired load, for example minimizing standing waves/reflected signals on the RF signal path 102.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. An RF impedance measurement circuit comprising:
    a sensing capacitor having a first terminal and a second terminal;
    a first amplitude detector coupled to the first terminal and configured to detect a first amplitude of a first input signal having a first oscillation frequency;
    a first frequency divider coupled to the first terminal, wherein the first frequency divider is configured to receive the first input signal and generate a first output signal having a second oscillation frequency, wherein the first oscillation frequency is an integer multiple of the second oscillation frequency;

a second amplitude detector coupled to the second terminal and configured to detect a second amplitude of a second input signal having a third oscillation frequency;

a second frequency divider coupled to the second terminal, wherein the second frequency divider is configured to receive the second input signal and generate a second output signal having a fourth oscillation frequency, wherein the third oscillation frequency is an integer multiple of the fourth oscillation frequency; and a phase detection circuit configured to detect a phase difference between the first terminal and the second terminal based on the first output signal and the second output signal; and a processing unit configured to calculate a load impedance of an RF signal path that includes the sensing capacitor based on the first amplitude, the second amplitude, and the phase difference.

2. The RF impedance measurement circuit of claim 1, wherein the first amplitude detector and the first frequency divider are each coupled capacitively to the first terminal.

3. The RF impedance measurement circuit of claim 2, wherein the second amplitude detector and the second frequency divider are each coupled capacitively to the second terminal.

4. The RF impedance measurement circuit of claim 1, wherein the phase detection circuit comprises a mixer configured to mix the first output signal with the second output signal.

5. The RF impedance measurement circuit of claim 1, wherein:

the phase detection circuit is a first phase detection circuit and the RF impedance measurement circuit further comprises a second phase detection circuit;

the first frequency divider and the second frequency divider each comprise a first output;

the first frequency divider further comprises a second output that is phase offset with respect to the first output of the first frequency divider, the first phase detection circuit is connected to the first output of the first frequency divider and to the first output of the second frequency divider; and the second phase detection circuit is connected to the second output of the first frequency divider and to the first output of the second frequency divider.

6. The RF impedance measurement circuit of claim 5, wherein the first output of the first frequency divider and the first output of the second frequency divider are in-phase outputs and the second output is a quadrature output.

7. The RF impedance measurement circuit of claim 1, further comprising a voltage divider connected to the sensing capacitor, wherein the first amplitude detector and the first frequency divider are connected to a midpoint of the voltage divider.

8. The RF impedance measurement circuit of claim 7, wherein the voltage divider is a capacitive voltage divider.

9. The RF impedance measurement circuit of claim 7, wherein the voltage divider comprises an adjustable capacitor.

10. The RF impedance measurement circuit of claim 1, further comprising an RF transmitter and an antenna, wherein the antenna is connected to the RF transmitter through the sensing capacitor.

11. The RF impedance measurement circuit of claim 10, further comprising a tunable matching network connected to the sensing capacitor.

12. The RF impedance measurement circuit of claim 11, wherein the tunable matching network connects the antenna to the RF transmitter.

13. A method of RF impedance measurement, the method comprising:

detecting a first amplitude of a first input signal having a first oscillation frequency at a first amplitude detector coupled to a first terminal of a sensing capacitor;

receiving the first input signal via a first frequency divider;

generating, via the first frequency divider, a first output signal having a second oscillation frequency, wherein the first oscillation frequency is an integer multiple of the second oscillation frequency;

detecting a second amplitude of a second input signal having a third oscillation frequency at a second amplitude detector coupled to a second terminal of the sensing capacitor;

receiving the second input signal via a second frequency divider;

generating, via the second frequency divider, a second output signal having a fourth oscillation frequency, wherein the third oscillation frequency is an integer multiple of the fourth oscillation frequency;

detecting a phase difference between the first terminal and the second terminal based on the first output signal and the second output signal, wherein an input of the first frequency divider is coupled to the first terminal and an input of the second frequency divider is coupled to the second terminal; and calculating a load impedance of an RF signal path that includes the sensing capacitor based on the first amplitude, the second amplitude, and the phase difference.

14. The method of claim 13, wherein the detecting the phase difference comprises a mixer mixing the first output signal and the second output signal.

15. The method of claim 13, wherein detecting the phase difference comprises detecting the phase difference additionally based on an additional output signal of the first frequency divider that is phase offset with respect to the first output signal and with respect to the second output signal.

16. A method of impedance tuning of an RF transmitter arrangement, the RF transmitter arrangement comprising an RF transmitter connected to an antenna through an RF signal path, the method comprising:

the RF transmitter transmitting an RF signal through the RF signal path;

measuring a load impedance for the RF signal path via the method of claim 13; and tuning a tunable impedance in the RF signal path based on the measuring.

17. The method of claim 16, wherein the tunable impedance comprises a tunable matching network.

18. The method of claim 16, wherein the tunable impedance comprises a source impedance of the RF transmitter.

19. The method of claim 16, wherein the RF transmitter is comprised in a phased-array transmitter system.

20. The method of claim 16, further comprising amplifying the RF signal upstream of the first amplitude detector.

* * * * *